United States Patent [19]
Bindell et al.

[11] Patent Number: 5,804,460
[45] Date of Patent: Sep. 8, 1998

[54] LINEWIDTH METROLOGY OF INTEGRATED CIRCUIT STRUCTURES

[75] Inventors: Jeffrey Bruce Bindell, Orlando, Fla.; Dennis Earl Schrope, Coplay, Pa.; Fred Anthony Stevie, Orlando, Fla.; Richard J. Dare, Whitehall, Pa.; Larry E. Plew, St. Cloud, Fla.

[73] Assignee: Lucent Technologies, Inc., Murray Hill, N.J.

[21] Appl. No.: 931,066

[22] Filed: Sep. 15, 1997

Related U.S. Application Data

[63] Continuation of Ser. No. 366,357, Dec. 29, 1994, abandoned.

[51] Int. Cl.$^6$ .............................. G01D 18/00; G06K 9/28
[52] U.S. Cl. .................... 438/16; 250/252.1; 250/492.3; 250/307; 250/311; 382/151
[58] Field of Search ............................. 250/252.1, 492.3, 250/307, 311; 438/16, 101, 142; 382/151

[56] References Cited

U.S. PATENT DOCUMENTS

| | | | |
|---|---|---|---|
| 4,221,965 | 9/1980 | Konishi et al. | 250/311 |
| 4,755,047 | 7/1988 | Kato et al. | 356/376 |
| 4,766,411 | 8/1988 | Seiler et al. | 250/252.1 |
| 4,943,722 | 7/1990 | Breton et al. | 150/310 |
| 5,029,250 | 7/1991 | Komatsu et al. | 250/310 |
| 5,081,353 | 1/1992 | Yamada et al. | 250/306 |
| 5,106,771 | 4/1992 | Emerson et al. | 437/40 |
| 5,140,164 | 8/1992 | Talbot et al. | 250/492.2 |
| 5,229,607 | 7/1993 | Matsui et al. | 250/306 |
| 5,444,242 | 8/1995 | Larson et al. | 250/305 |

FOREIGN PATENT DOCUMENTS

| | | | |
|---|---|---|---|
| 0 539 686 A | 5/1993 | European Pat. Off. | G03F 7/00 |
| 2 257 514 | 1/1993 | United Kingdom | G03B 41/00 |
| WO 94 22028 A | 9/1994 | WIPO | G01R 21/00 |

OTHER PUBLICATIONS

Patent No. European Search Report, issued in England on Apr. 4, 1997 to 95309307.7.

N. L. Istomina et al, "Short Length Gauges For Monitoring The Manufacture of Integrated Circuits", Measurement Techniques, vol. 35, No. 1, 1 Jan. 1992, pp. 36–40.

Timothy R. Corle, "Submicron Metrology In The Semiconductor Industry", Solid State Electronics, vol. 35, No. 3, 1 Mar. 1992, pp. 391–402.

M. W. Cresswell et al, Proceedings Of the International Conference on Microelectronic Test Structures (ICMTS), Barcelona, Mar. 22–25, 1993, "Test Structure For The In–Plane Locations Of Projected Features With Nanometer–Level Accuracy Traceable To A Coordinate Measurement System", pp. 255–261.

Focused Ion Beam Applications for Design and Product Analysis J. A. Lange and S. Czapski, Motorola, Inc. Austin, TX.

Microfocused Ion Beam Applications in Microelectronics L. R. Harriott, AT&T Bell Laboratories, 600 Mountain Avenue, Murray Hill, NJ 07974, USA. 25 Jul. 1988.

Applications of Focused Ion Beams Indrajit Banerjee and Richard H. Livengood, Intel Corporation, Santa Clara, California 95052.

*Primary Examiner*—David Graybill
*Attorney, Agent, or Firm*—Anthony Grillo

[57] ABSTRACT

Illustratively, the present invention includes a method of integrated circuit manufacturing which includes forming a raised topological feature upon a first substrate. A portion of the raised feature is removed, thereby exposing a cross sectional view of the raised feature with the substrate remaining substantially undamaged. The cross sectional view has a critical dimension. The critical dimension of the cross sectional view is measured using a first measuring instrument. Then the critical dimension is measured using a second measuring instrument. The measurements of the first and second measuring instruments are correlated. Then, using the second measuring instrument, raised features via plurality of second substrates are measured.

10 Claims, 2 Drawing Sheets

LINEWIDTH METROLOGY OF INTEGRATED CIRCUIT STRUCTURES

This application is a Continuation of application Ser. No. 08/366,357 filed Dec. 29, 1994 abandoned.

TECHNICAL FIELD

This invention relates to integrated circuit manufacturing in general and more particularly to the accurate determination of linewidths and other critical dimensions during the manufacture of integrated circuits.

BACKGROUND OF THE INVENTION

During many of the steps involved in the manufacture of integrated circuits, features are defined by photolithographic methods which must be tightly controlled. These features are difficult to measure using conventional optical techniques. Feature size measurement and definition is a difficult process because the features are small and the feature edges are not perfectly straight and vertical (i.e., perpendicular to the underlying substrate). Often the feature edges may be sloped or even somewhat irregular and the location of these edges are often not clearly delineated in measuring instruments. Consequently, a precise definition of the term feature "width," and measurement of that "width" may be difficult.

High voltage scanning electron microscopes (utilizing energies of 15–30 kV) can be used to measure small features on a substrate. However, the use of high voltage scanning electron microscopes (SEM) usually requires breaking the wafer and the SEM's high energy electrons can damage the circuits on the wafer.

Recently, low voltage (typically less than 2 kV) scanning electron microscopes (SEM) have been used for the measurement of feature sizes mentioned above. Most methods of measurement utilizing a low voltage SEM produce a magnified image of the feature under consideration which is then converted into a digital signal. Mathematical operations are then performed on the digital signal to define the edges of the feature in a consistent manner. These measurement techniques may be applied to both photoresist and underlying features which have been defined by photolithographic processes.

It is important to be able to relate the numerical values of the digitized signal to the corresponding physical points on the edge of the feature. When measuring the pitch, or distance between two identical features, this relationship does not need to be known exactly because the distance between corresponding points of the digital signal for adjacent features will correspond to the pitch, with relative errors canceling in the process. Consequently, a measurement instrument can be fairly easily calibrated for pitch measurements (and therefore calibrated for magnification also) by comparison to pitch standards which are available from the National Institute of Standards and Technology (NIST).

However, the problem of producing a generally usable linewidth standard (as opposed to a pitch standard, suitable for low voltage SEM use) has proven much more difficult because every integrated circuit layer has a different structure and because every manufacturer or production facility implements somewhat different integrated circuit manufacturing processes. Therefore, each manufacturer's features are different in size and shape from the features of other manufacturers. Those concerned with the development of technology have consistently sought methods and apparatus for creating or producing local standards, for example, for linewidth measurement, which are traceable to national standards, for example, the standards maintained by NIST.

SUMMARY OF THE INVENTION

Illustratively, the present invention includes a method of integrated circuit manufacturing which includes forming a raised topological feature upon a first substrate. A portion of the raised feature is removed, thereby exposing a cross sectional view of the raised feature with the substrate remaining substantially undamaged. The cross sectional view has a critical dimension. The critical dimension of the cross sectional view is measured using a first measuring instrument. Then the critical dimension is measured using a second measuring instrument. The measurements of the first and second measuring instruments are correlated. Then, using the second measuring instrument, raised features via plurality of second substrates are measured.

DETAILED DESCRIPTION

Figure 1:
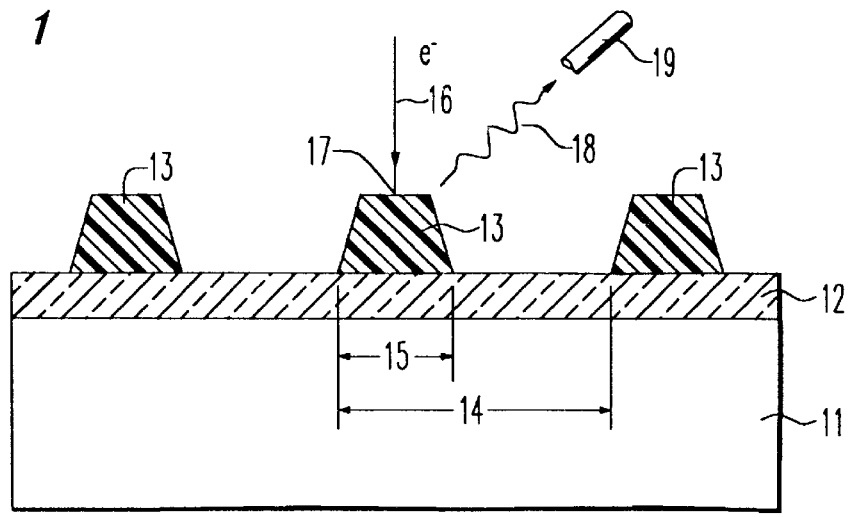
FIGS. 1, 4 and 5 are cross-sectional views of partially fabricated integrated circuits, FIG. 5 being an enlarged view of a portion of FIG. 4.

In FIG. 1, reference numeral 11 denotes a substrate which may be silicon, doped silicon, epitaxial silicon, etc. In general, the term substrate is used to refer to any material having a surface upon which other materials may be adhered or deposited. Typically, microelectronic devices may be formed upon the substrate. Such devices may, for example, have features which have widths less than 1 $\mu$m which must be measured accurately. The substrate may have a layer 12 or stack of layers of additional materials such as silicon oxide, silicon nitride, aluminum, polysilicon, etc. deposited upon it. The surface of this layer 12 or stack of layers may be either planar or patterned.

Two types of dimensional measurements are usually required for the successful manufacture of microelectronic devices formed upon a substrate 11: a) the distance between equivalent features, referred to as "pitch," and b) the actual dimension of a single feature, referred to as "width" or "linewidth." For the purpose of describing this invention, we shall refer to features which consist of parallel runners (or lines) of photoresist material having width denoted by W and pitch denoted by P. The scope of this invention is not limited, however, to features in photoresist; the features may be defined in any material and may, for example, include aluminum runners or even oxide vias, etc. that require accurate measurement.

Reference numeral 13 denotes one of a series of features formed in photoresist material. Assuming that each of these features is intended to be of the same dimension, the pitch P is shown as reference numeral 14 while the width W is indicated by reference numeral 15. When small feature dimensions are measured, it is common practice to use various measurement techniques and equipment, including, but not limited to, optical microscopy, one of the scanning probe microscopies (Atomic Force Microscopy, etc.) and scanning electron microscopy. In each of these techniques a type of probe is initially used to interact with the feature to be measured. Then, a digital or analog signal is created which contains the information which is to be converted or reduced to a measurement. For example, in the optical microscopy case, the signal might be a diffraction pattern. In the scanning electron microscope case, the signal would be a record of electron emission as a function of the electron beam's position on the surface (s) struck by the electron beam. It is from these digital (or analog) signals that metrological information is often obtained.

Figure 2:
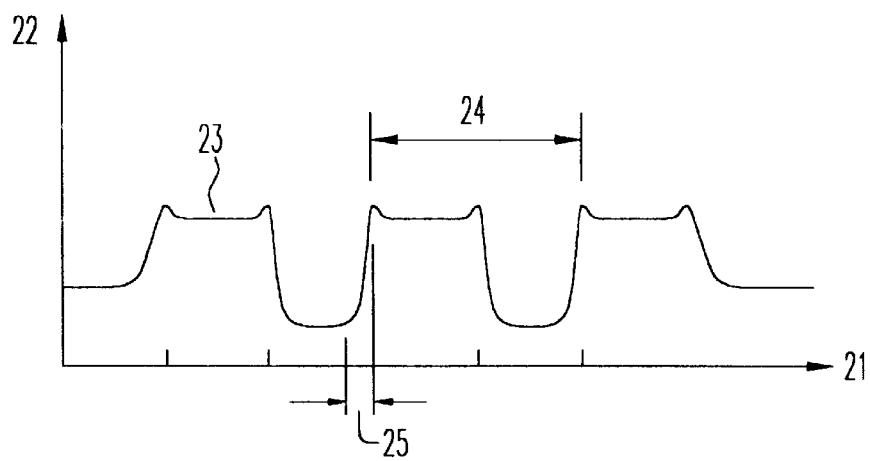
FIG. 2 is a graph of signal strength versus position typical of a scanning electron microscope (SEM)

When either a high voltage or low voltage scanning electron microscope is used, a primary electron beam 16 strikes the structure to be measured at a point 17 producing secondary electrons 18 which are detected by an electron detector 19 which then produces an output which varies with the position at which the primary electron beam strikes the structure. FIG. 2 shows one possible result of scanning the electron beam linearly across a structure. The horizontal axis 21 represents position across the structure while the vertical axis 22 represents one of the signals discussed in the previous paragraph. It is assumed that the distance along horizontal axis 21 has been calibrated according to one of the available NIST standards which are manufactured and certified for this purpose. Curve or signal 23 represents a typical example of a scan of an electron beam across a structure (such as a raised feature in photoresist 13). Thus, curve 23 may depict a typical output of an electron detector 19.

Curve or signal 23 has features which correspond to the actual object 13 being measured. In particular, the pitch 24 (or 14) can be determined as the distance between two corresponding points on curve 23. The width W (15), however, is more difficult to determine because the edge of a particular structure (such as 13) can only be determined by examination of curve 23 to be within a small distance 25. Thus, the exact position of the edge cannot be determined or defined precisely. The error in a width measurement might could be as large as twice the distance 25, since an error of equal magnitude is possible on each side of a single feature.

If the device is cleaved (or broken) directly through a device feature and the exposed edge is examined in a high voltage scanning electron microscope, the higher resolution of the instrument could be used to discern the edges more closely than the above signal allows. This would allow a better calibration to be affected but, since the sample is no longer whole, it could not be used as a local standard.

The present invention utilizes a high resolution Scanning Electron Microscope (SEM) to measure pitch and width of features on a wafer without any need to break the wafer (as is commonly done). This wafer containing measured features may then be utilized as a local standard providing that the SEM used to measure the features has itself been calibrated for magnification in a way which makes its distance measurements traceable to the NIST.

Since real samples cannot be viewed non-destructively in cross-section, real measurements are usually performed utilizing normal electron beam incidence. FIG. 2 demonstrates data collected in this way.

Figure 3:
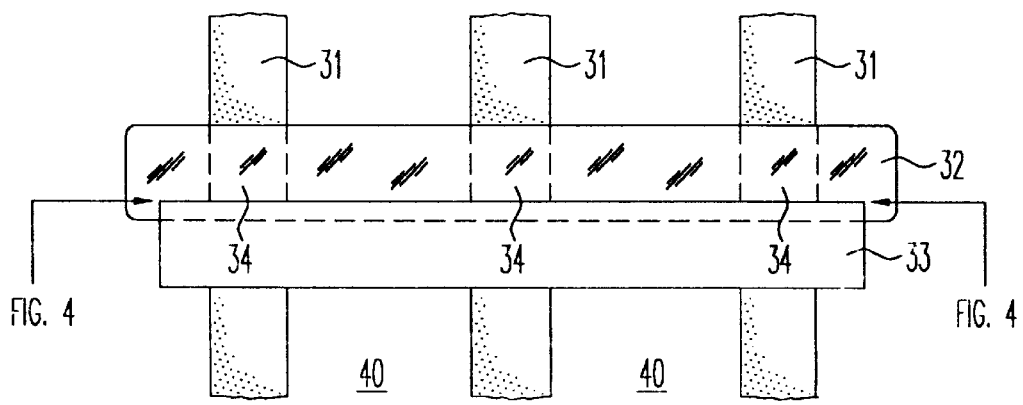
FIG. 3 is a plan top down view of a partially fabricated integrated circuit.

FIG. 3 shows a portion of a wafer which is being prepared for use as a local standard according to the present invention. It may be desirable to create a separate local standard for each processing level of each integrated circuit manufacturing process. Furthermore, each production facility might have its own standards. In an illustrative embodiment of the invention, a Focused Ion Beam (FIB) tool is utilized. A FIB produces a finely focused ion beam, which can be directed at any particular spot on a wafer with high precision. The beam can be rastered over an area of arbitrary size and shape. When the ion beam strikes the surface of a wafer, two outcomes are possible. The first outcome is a sputtering process whereby material is removed from the surface. Thus the FIB can be used to cut holes of arbitrary size, shape and depth into the surface. The second outcome may be achieved when a vapor containing a metallic element is admitted to the FIB chamber. The ion beam will break down the molecule and, under proper conditions, cause the metal to be deposited in a localized area. The FIB can therefore be used both to remove material or to deposit metal in well defined geometries. Both of these capabilities are used in some embodiments of the invention but the deposition of metal is not always essential for all embodiments.

Figure 4:
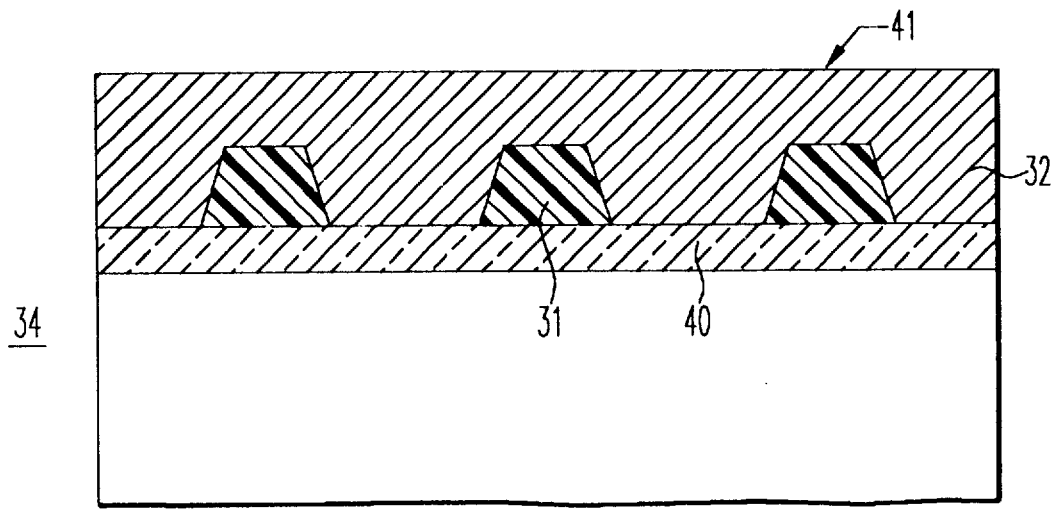

FIG. 3 represents a top down view of three elongated parallel features 31 formed upon substrate 40 (which may be illustratively silicon dioxide 12 upon silicon 11). Features 31 may be formed in photoresist; alternatively, they may be formed in silicon dioxide, silicon nitride, polysilicon, aluminum, tungsten, etc. Feature 31 may also be comprised of multiple layers, such as tin over aluminum. A transverse strip of metal 32 is formed over features 31 and substrate 40. Metal 32 may, illustratively, be tungsten formed by FIB. Metal 32 has a transverse elongated shape and spans several features 31. Next, a focused beam (FIB) is used to remove material (i.e., portions of features 31 and metal 32) from substrate 40 in an area denoted by reference numeral 33. Area 33 slightly overlaps metal 32. Thus, a portion of the already deposited metal 32 may be removed, thereby exposing surface 34 shown in cross-section in FIG. 4. It will be noted that upper surface 41 of metal 32 which has been formed by a FIB is inherently planarized. The entire wafer can now be removed from the FIB and placed in a high resolution SEM (generally operating at a higher voltage typically 15 to 30 kV) which has been tilted so that one can directly view the surface 34. This surface is shown schematically in FIG. 4 and enlarged in FIG. 5. The feature 31 is easily viewed in cross-section and it is surrounded by the metal 32. Metal 32 serves to reduce the charging of the specimen in the SEM, to increase the contrast between the feature and its background, and to produce uniform sputtering of nonuniform features, thereby allowing a better measurement to be made.

Figure 5:
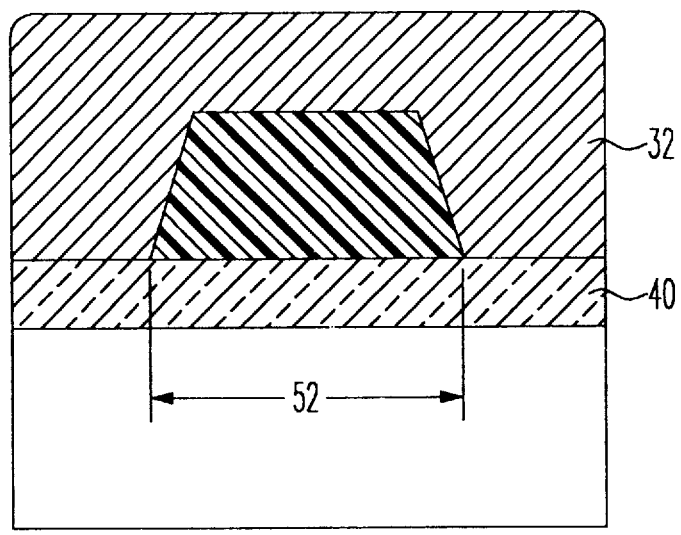

As shown in the enlarged view of FIG. 5, the cross-section is easily observable and the measurement of the feature width W 52 can be made with the great precision allowed by a high resolution high voltage SEM. The same cross section may then be viewed with a low voltage SEM. The results of the two measurements on the same sample may then be correlated. Thus, any subsequent wafer measurements made with the low voltage SEM may be converted to equivalent high voltage SEM measurements without the need to actually use a high voltage SEM on the subsequent wafers. Since normal metrology practice in a manufacturing environment forces the use of lower resolution, lower voltage SEM utilization, this method allows direct correlation between the low voltage signal (or signals from optical instruments) and the more precise and accurate high voltage SEM measurement made on the wafer. This wafer is then used to calibrate the low voltage instrument for routine measurements.

In practice, a standard wafer such as described herein may be prepared for each level of a microstructure which is to be measured. The standard wafer may be first prepared as previously described in the Focused Ion Beam system (or its equivalent) and cross-sections of the features of interest are exposed. The wafer is then transferred to a high resolution scanning electron microscope which has previously been accurately calibrated via standards traceable to NIST. This high resolution SEM is then used to accurately determine the feature sizes which, by virtue of the calibration used in the SEM, allows the wafer to be considered to be a secondary standard for metrology purposes.

The standard is next placed into a Low Voltage Metrology SEM (or some other instrument) where a signal trace such as that shown by reference numeral 23 of FIG. 2 is carefully determined. Knowing the actual size of the feature, the appropriate correlation can be determined for converting critical aspects of the low voltage SEM signal to the known actual feature size. Other wafers, such as production wafers, can now be placed into the metrology system and the same correlation can be used to correlate or convert low voltage SEM measurements to high voltage SEM measurements.

Measurements of linewidth on a plurality of production wafers may be made using the low voltage SEM. These measurements may be made with the electron beam normal to the wafer and without the need to break the wafer or deposit metal. These measurements or production wafers may, of course, be immediately correlated to high voltage SEM measurements using the process described above without the need to actually use a high voltage SEM on each production wafer.

Thus, lots of production wafers may have critical features very accurately measured non-destructively by low voltage SEM. Those wafers whose critical features are found to be too large or small may be scrapped or reworked.

The wafer which was prepared with FIB metallization may be retained as a standard and low voltage SEM's may be periodically recalibrated using this wafer.

We claim:

1. A method of integrated circuit manufacturing comprising:

forming a raised topographical feature upon a first substrate;

removing a portion of said raised feature, thereby exposing a cross-section of said raised feature, said substrate remaining substantially undamaged, said cross-section having a critical dimension;

measuring said critical dimension of said cross-section using a first type of measuring instrument;

measuring said critical dimension of said cross-section using a second type of measuring instrument, said second type of measuring instrument for performing a non-destructive type of measurement;

correlating the measurements performed by said first type of measuring instrument and said second type of measuring instrument to determine a measurement correlation function:

obtaining a plurality of substrates, each containing a raised feature essentially identical in formation and topography to said first substrate raised feature;

using said second type of measuring instrument, measuring raised topographical features on said plurality of substrates without removing any portion thereof; and using the measurement correlation function and the measurement from said second type of measuring instrument, converting said second type of instrument measurement into a measurement associated with the first type of measuring instrument.

2. The method of claim 1 in which a metal is deposited over said raised topographical feature on said first substrate and a portion of said metal is removed together with a portion of said raised feature.

3. The method of claim 1 in which said removing step is accomplished with a focused ion beam.

4. The method of claim 2 in which said deposition step is accomplished with a focused ion beam.

5. The method of claim 1 in which said first measuring instrument is chosen from the group consisting of a high voltage scanning electron microscope and an atomic force microscope.

6. The method of claim 1 in which said raised topographical feature is formed of a material chosen from the group consisting of: photoresist, an oxide of silicon, silicon nitride, a metal and silicon.

7. The method of claim 1 in which said raised topographical feature is a gate.

8. The method of claim 1 in which said raised topographical feature is photoresist with a gate defined therein.

9. The method of claim 1 in which said first substrate is a material chosen from the group consisting of silicon, silicon nitride, an oxide of silicon, and a metal.

10. The method of claim 1 in which said first instrument is calibrated to NIST standards.

* * * * *